US006479217B1

(12) United States Patent
Grinevich et al.

(10) Patent No.: US 6,479,217 B1
(45) Date of Patent: Nov. 12, 2002

(54) METHOD FOR PRODUCING SELECTIVELY COLORABLE PRINTING PLATES

(75) Inventors: Oleg V. Grinevich, Bowling Green, OH (US); Alexander Mejiritski, Bowling Green, OH (US); Petr Serguievski, Perrysburg, OH (US); Douglas C. Neckers, Perrysburg, OH (US)

(73) Assignee: Spectra Group Limited, Inc., Maumee, OH (US)

( * ) Notice: Subject to any disclaimer, the term of this patent is extended or adjusted under 35 U.S.C. 154(b) by 16 days.

(21) Appl. No.: 09/790,996

(22) Filed: Feb. 22, 2001

(51) Int. Cl.$^7$ .............................. G03F 7/30; G03F 7/38
(52) U.S. Cl. .................. 430/306; 430/300; 430/309; 430/292
(58) Field of Search ................. 430/300, 306, 430/309, 292

(56) References Cited

U.S. PATENT DOCUMENTS

| 4,033,773 A | 7/1977 | Lewis et al. ............... 96/115 P |
| 4,139,390 A | 2/1979 | Rauner et al. .............. 96/91 N |
| 4,425,424 A | 1/1984 | Altland et al. ............ 430/270.1 |
| 4,499,304 A | 2/1985 | Gabrielsen et al. ........... 564/92 |
| 4,598,036 A | 7/1986 | Iwasaki et al. ........... 430/270.1 |
| 4,714,751 A | 12/1987 | Schornick et al. .......... 528/103 |
| 4,859,572 A | 8/1989 | Farid et al. .............. 430/281.1 |
| 4,962,011 A | 10/1990 | Aldag et al. ............. 430/281.1 |
| 5,006,447 A | 4/1991 | Umeda et al. ........... 430/272.1 |
| 5,030,548 A | 7/1991 | Fujikura et al. .......... 430/281.1 |
| 5,141,839 A | 8/1992 | Mitchell et al. ......... 430/276.1 |
| 5,204,222 A | 4/1993 | Gersdorf et al. ......... 430/281.1 |
| 5,204,227 A | 4/1993 | Larimer ..................... 430/331 |
| 5,215,859 A * | 6/1993 | Martens ...................... 430/309 |
| 5,252,432 A | 10/1993 | Bach et al. ................. 430/306 |
| 5,472,824 A | 12/1995 | Schober et al. ............. 430/309 |
| 5,639,802 A | 6/1997 | Neckers et al. ............... 522/25 |
| 5,665,522 A | 9/1997 | Vogel et al. ............. 430/278.1 |
| 5,792,879 A | 8/1998 | Gessner et al. ............. 552/108 |
| 5,942,554 A | 8/1999 | Ren et al. ..................... 522/25 |
| 6,030,749 A * | 2/2000 | Takahashi ................ 430/273.1 |
| 6,037,085 A | 3/2000 | Holman, III et al. ......... 430/18 |
| 6,037,101 A | 3/2000 | Telser et al. ............. 430/286.1 |
| 6,040,116 A | 3/2000 | Telser et al. ................ 430/306 |
| 6,133,336 A | 10/2000 | Popat et al. .................. 522/31 |

FOREIGN PATENT DOCUMENTS

EP    0511403 A1  * 11/1992

OTHER PUBLICATIONS

March, Jerry, Advanced Organic Chemistry: REactions, Mechanisms, and Structure, Second edition, McGraw–Hill Book Company, New York, New York, 1977, pp. 1073–1076.*

* cited by examiner

*Primary Examiner*—Cynthia Hamilton
(74) *Attorney, Agent, or Firm*—Thompson Hine LLP

(57) ABSTRACT

A method for forming selectively colored printing plates using photosensitive recording elements is disclosed wherein the photosensitive recording element contains a photopolymerizable recording layer comprising a photopolymerizable monomer, a radical photoinitiator, a color former, and a color photoinitiator. A method for producing a printing plate from the photosensitive recording element involves exposing the back surface of the recording layer to a dose of actinic radiation, imagewise exposing the front of the photopolymerizable recording layer to another dose of actinic radiation thereby forming exposed and unexposed areas on the front of the recording layer wherein the exposed areas are cured and undergo a color change by exposure to the actinic radiation, and then removing the unexposed areas of the imagewise exposed recording layer thereby forming an image in relief wherein the image portion and the non-image portion are of different color and wherein the contrast between these portions due to the color difference is visually detectable.

28 Claims, No Drawings

METHOD FOR PRODUCING SELECTIVELY COLORABLE PRINTING PLATES

BACKGROUND OF THE INVENTION

The present invention relates to a method for forming selectively colored printing plates using photosensitive recording elements.

Flexographic printing plates are widely used, primarily in the packaging industry, for printing on a wide variety of substrates. Flexographic printing plates can be used to print on soft and easily deformable substrates such as cardboard, plastic films, etc. without sacrificing print quality. Flexographic printing plates are characterized by a relief portion corresponding to the image to be printed. During printing, the relief portion of the plate is inked and subsequently transfers the printed image to the substrate by impression.

Flexographic printing plates can be prepared from a variety of materials including rubber and photosensitive compositions. The conventional process for preparing flexographic plates from rubber involves several laborious steps including art work, photo engraving and formation of the plate by vulcanizing the rubber in a suitable mold. Rubber flexographic plates can also be prepared by laser engraving a rubber ablatable element structure thereby avoiding the molding step in the conventional process.

Flexographic printing plates can also be prepared from photopolymerizable compositions, such as those described in U.S. Pat. Nos. 4,323,637 and 4,427,749. The photopolymerizable compositions generally comprise a binder, at least one monomer and a photoiniator. The photopolymerizable composition in the form of a photosensitive recording element is image wise exposed to actinic radiation thereby polymerizing the polymerizable composition in the exposed areas. The unexposed areas of the photopolymerizable layer are removed, typically by washing with a solvent developer, thereby forming a printing relief which can be used for flexographic printing. Image wise exposure of the photosensitive recording element typically involves the use of a negative mask having a predetermined pattern of transparent and opaque areas covering the photopolymerizable layer. Alternatively, the negative can be eliminated by the use of a laser beam capable of directly recording information on the photosensitive element as disclosed in U.S. Pat. No. 5,262,275 to Fan.

Conventional flexographic printing plates are characterized by relief portions corresponding to the exposed portion and non-image portions corresponding to the non-exposed portions wherein the color and appearance of the relief portion and the non-image portion are the same. Therefore, there is little or no contrast between the relief portion and the non-image portion of the plate. The inability to quickly and accurately distinguish between the image and non-image areas of the plate can create quality control problems and interfere with proper positioning of the printing plate onto a print cylinder of a press. Accordingly, it would be desirable to provide a photosensitive recording element useful in producing a flexographic printing plate wherein the areas of the recording element exposed to actinic radiation are cured and colored to provide an obvious contrast between the image and non-image portions of the flexographic printing plate.

U.S. Pat. No. 6,030,749 to Takahashi describes one method for producing a flexographic printing element wherein the image portion has a color which is different from the color of the non-image portion based on the color change produced by an anthraquinone dye exposed to ultraviolet light having a wavelength from 300 to 400 nm. The disclosure of this reference is limited to the use of anthraquinone dyes which exhibit a color change upon being irradiated with an ultraviolet ray of wavelength in the range from 300 to 400 nm in the presence of a radical producer capable of producing a free radical upon irradiation.

Photocurable and photocolorable compositions which can be both cured and colored upon exposure to actinic radiation are known. However, there is no disclosure or suggestion of using such compositions in the production of printing plates. The following references, incorporated herein by reference, disclose various photocurable and photocolorable compositions.

Commonly assigned U.S. Pat. No. 5,942,554, herein incorporated by reference, discloses a curable composition containing a color precursor and an onium salt which is both cured and colored upon exposure to actinic radiation. Color precursors disclosed as being useful are those which are capable of reacting with acid or whose excited states are capable of donating an electron.

Commonly assigned U.S. patent application Ser. No. 09/558,899 filed on Apr. 26, 2000 (Attorney Docket No. 594562-024), herein incorporated by reference, discloses selectively colorable polymerizable compositions comprising a leucobase color former and a leuconitrile color former. Irradiation of the composition cures and selectively colors the composition. The color at any one location depends on the actinic dose and the interaction of the leucobase and leuconitrile color formers. In one embodiment, a selectively colorable, polychromic composition is provided wherein low light exposure creates a polymer of one color, intermediate light exposure changes the color of the polymer and a high dosage of light exposure bleaches the color of the polymer.

Selectively colorable polymerizable compositions are also disclosed in commonly assigned U.S. patent application Ser. No. 09/638,252 filed on Aug. 14, 2000 (Attorney Docket No. 594562-027), the disclosure of which is incorporated herein by reference. A selectively colorable polymerizable composition comprising a leucobase color former and an oxidizing agent which is irradiated with light of a particular wavelength and specific intensity for a specified duration is disclosed. Exposure to actinic radiation cures the composition and activates the color former which can be optionally deactivated or bleached by further exposure. The irradiation dosage can be varied to selectively color the polymeric body whereby the resultant color of any particular area depends on the exposure dose received at that location. By varying the dose, a polymeric body can be prepared having distinctly colored elements at specific locations.

International Publication Number WO 97/09168 to Zeneca discloses a photocurable, photocolorable composition which is irradiated with a low dose of light to cure and a different dose of light, preferably higher, to cause color formation. Color formation or color change occurs as a result of contact between a color former and a photochemically generated developer. The color formers disclosed as being useful include acid sensitive compounds such as lactones, fluorans, etc.

SUMMARY OF THE INVENTION

The present invention relates to selectively colorable photosensitive recording elements used in the production of printing plates and to a method for forming selectively colored printing plates using such recording elements. In accordance with the invention a photosensitive recording element containing a photopolymerizable recording layer is disclosed. The photopolymerizable recording layer of the invention comprises a photopolymerizable monomer, a radical photoinitiator, a color former, and a color photoinitiator. The recording layer may optionally include a polymeric binder. Color formers can be leuco dyes or reducible dyes. The present invention is also directed to a method for producing a printing plate from the photosensitive recording element of the invention by uniformly exposing the back side of the photopolymerizable recording layer to actinic radiation of a first dose thereby forming a cured back surface without coloration or color change, imagewise exposing the front of the photopolymerizable recording layer to a second dose of actinic radiation thereby forming exposed and unexposed areas on the recording layer wherein the exposed areas are cured and undergo a color change by exposure to the actinic radiation and removing the unexposed areas of the imagewise exposed recording layer thereby forming an image in relief wherein the image portion and the non-image portion are different in color from each other and wherein the contrast between these portions due to the color difference is visually detectable. Furthermore, selective control of light dose provides a visually detectable difference in coloration between the cured back surface of the photopolymerizable recording layer and the cured image areas on the front of the recording layer.

The present invention provides a visible color contrast between imaged areas on the front of a plate and the uniformly exposed back surface of the plate. The imaged areas on the front of the plate and the blanket exposed back of the plate are both cured, but of different coloration due to selective control of the light dose to which each area is subjected. Furthermore, the photosensitive recording element of the present invention provides a visible color contrast between the imaged and non-imaged areas on the front of a printing plate. The color contrast provided by the present invention may be the result of the interaction between a leuco color former and an oxidizing agent upon exposure to actinic radiation which selectively cures the composition and causes color formation. Alternatively, the color contrast may be as a result of the interaction between a dye and a reducing agent or the bond breaking of a leuco dye capable of forming color by bond heterolysis.

Color formers found to be useful in the present invention include those which are capable of reacting with acid as is well known in the art, or whose excited states are capable of donating an electron. Examples of suitable leucodyes include lactones, leucobases of di- and tri-arylmethane dyes, leuconitrile colorformers, and leucobase color formers in combination with leuconitrile color formers. Examples of dyes useful in the present application include fluorones, xanthones, thiazines, oxazines, phenazines and the like.

Color photoinitiators, as used herein, are agents capable of reacting with a leuco dye or a reducible dye upon excitation and inducing or generating color formation or color change in a leuco dye or reducible dye. Examples of color photoinitiators useful in the present invention include oxidizing agents (such as onium salts) and reducing agents (such as amines).

Oxidizing agents useful in the present invention include compounds which are electron acceptors capable of oxidizing the leucodye and generating the colored carbocation or generating an acidic species which converts the color precursor into its colored form. Typical photosensitive oxidizing agents include onium salt such as iodonium, sulfonium and the like, transition metals, iron salts, uranyl salts, etc. used in the absence or presence of an oxidizing species such as hydrogen peroxide.

Reducing agents useful in the present invention include compounds which are electron donors capable of reducing the dye and generating the colorless anion, radical anion, or radical which converts into the stable leucodye. Typical photosensitive reducing agents include molecules with free electron pairs such as amines, borates, gallates, stannates and the like.

The polymeric binders useful in the present invention include those typically used in the production of flexographic photopolymer printing plates. Examples of suitable polymeric binders include block copolymers of styrene and butadiene or of styrene and isoprene, chloroprene nitrile rubbers, urethane elastomers, butyl rubbers and derivatives of butyl rubber. Preferred binder materials include tri-block copolymers such as polystyrene-polybutadiene-polystyrene (SBS), polystyrene-polyisoprene-polystyrene (SIS) and polystyrene-poly(ethylenebutylene)-polystyrene (SEBS).

The photopolymerizable monomers and radical photoinitiators useful in the present invention are those typically used in the production of flexographic photopolymerizable printing plates. Suitable monomers include esters or amides of acrylic acid or methacrylic acid with monofunctional or polyfunctional alcohols, amines, aminoalcohols, or hydroxyethers and hydroxyesters. Radical photoinitiators which can be used for the mixtures according to the invention are the known compounds which display an adequate thermal stability during processing of the recording materials and also adequate free radical formation on exposure, with initiation of polymerization of the monomers. They should absorb light in a wavelength range of about 250 to about 500 nm with the formation of free radicals.

Flexographic printing plates prepared in accordance with the present invention are particulary useful for plate proofing prior to use due to the selective color contrast in the imaged areas versus the non-image areas of the printing plate. The color contrast will facilitate quality control because any faults or errors in the image formation will be easier to detect visually. Furthermore, the increased contrast of the image on the printing plate will facilitate accurate positioning of the printing plate on the print cylinder of a printing press.

DETAILED DESCRIPTION OF THE INVENTION

In accordance with the present invention, a method for producing a printing plate using a selectively colorable photosensitive recording element is provided. The invention is particularly useful for the production of a printing plate wherein the imaged areas and the non-imaged areas are of a different color thereby providing sufficient contrast so that the image is visibly apparent on the printing plate. The photosensitive recording element of the invention is selectively cured and either colored or bleached by exposure to controlled dosages of actinic radiation. Furthermore, selective control of light dose can provide cured portions of the recording element of contrasting colors.

In accordance with the present invention, a photosensitive element containing a photopolymerizable recording layer comprising a photopolymerizable monomer, a radical photoinitiator, a color former and a color photoinitiator is provided. The recording layer may optionally include a polymeric binder.

The present invention is also directed to a method for producing a printing plate using such a photosensitive recording element by exposing the back surface of the recording layer to a first dose of actinic radiation to cure the back surface, imagewise exposing the front surface of the photopolymerizable recording layer to a second dose of actinic radiation thereby forming exposed and unexposed areas on the recording layer wherein the exposed areas are cured, and removing the unexposed areas of the imagewise exposed recording layer thereby forming an image in relief wherein the image areas are of a different color than the non-imaged areas. Furthermore, the present invention provides for selective control of light dose such that curing of the recording element may occur without any change in color or be concomitant with a change in color of the exposed areas of the recording element, depending on the light dose.

The photosensitive recording element used for preparing printing plates typically also comprises a support optionally having an adhesive layer formed on a separate surface in contact with the photopolymerizable recording layer and a coversheet present directly on the photopolymerizable recording layer. Generally, preparation of a printing plate from the photosensitive recording element is performed according to a process comprising uniform exposure (back exposure) over the support side, relief exposure, removal of the unexposed, uncured areas of the recording layer and post-exposure. To maximize contrast of the image areas versus the non-image areas (including the back) of the printing plate, the photopolymerizable recording layer preferably cures at a lower dose of actinic radiation than is required to create a color change in the composition. Accordingly, back exposure of the photosensitive recording element can be conducted at a dose of actinic radiation which cures but does not change the color of the base of the plate and the relief exposure can be conducted at a dose which both cures and changes the color of the relief portions of the plate, thereby providing a visually detectable color contrast between the image portion and the non-image and base portions of the plate. As used herein, a visually detectable color contrast represents either a difference in coloration, shade or intensity between two areas on the recording layer or printing plate which can be detected visually to distinguish between the two areas. Those skilled in the art will appreciate that the color determinative irradiation step can be conducted before, after or simultaneously with the polymerization or crosslinking step (back exposure). Furthermore, back exposure is not essential and can be omitted. Generally, however, to obtain a stable relief, it is preferred to perform a back exposure and, in this instance, to perform back exposure before relief exposure.

The typical actinic dose for back exposure ranges from 0 to 1,500 $mJ/cm^2$ according to the thickness to which the back surface is to be cured. The typical actinic dose for the relief exposure is from 500 to 14,000 $mJ/cm^2$ according to the fineness of an image to be obtained. If post-exposure of the printing plate is conducted it is typically at an actinic dose of up to 1,500 $mJ/cm^2$. Accordingly, in one embodiment of the invention, back exposure of the photosensitive recording element causes photopolymerization or curing of the base part of the plate without color formation of the leuco color former, while the higher dosage of actinic radiation associated with relief exposure causes both photopolymerization and selective coloration of the image areas of the printing plate.

In accordance with another aspect of the invention, the original recording element is colored and the color is bleached upon exposure to actinic radiation. Accordingly, the base part of the plate is colored and remains colored after curing by exposure to actinic radiation. Imagewise exposure of the front surface of the recording layer causes both photopolymerization and photobleaching of the image areas of the printing plate to provide color contrast between the image and non-image areas wherein the contrast produced is visually detectable.

The photosensitive recording element of the present invention can be exposed image-wise in a conventional manner. The conventional manner for image-wise exposing the photopolymerizable recording layer involves placing an image-bearing process transparency, for example, a line or half dash tone negative, over the photopolymerizable layer. The negative is designed to transmit actinic radiation through certain portions of and to absorb or reflect actinic radiation at other portions so that the photopolymerizable layer underneath the negative is cured and, in the case of the present invention, colored or bleached image-wise according to the portion of the negative that transmits the radiation. Alternatively, it is also believed that image-wise exposure can also be achieved by directly recording information on a photosensitive element, e.g., by means of a laser beam. The image to be developed could be translated into digital information and the digital information used to place the laser for imaging. Selective coloration of the image portion of the plate may still require UV exposure in order to activate the leuco color formers in the photopolymerizable composition if the digital imaging method utilized does not cause the imaged areas to change in color relative to the rest of the plate.

Actinic radiation from any source and of any type can be used in these initiated processes. The radiation may emanate from point sources or be in the form of parallel rays or divergent beams. By using a broad radiation source, relatively close to the image-bearing transparency, the radiation passing through the clear areas of the transparency enters as divergent beams and thus irradiates a continually divergent area in the photopolymerizable layer below the clear portions of the transparency, resulting in a polymeric relief having its greatest width at the bottom of the photopolymerized layer. Examples of suitable sources of actinic light include commercial UV fluorescent tubes, medium pressure, high pressure and low pressure mercury lamps, super actinic fluorescent tubes, pulsed xenon lamps, lamps doped with metal iodines, carbon arc lamps and sterilization lamps.

After exposure and prior to developing, the recording layer will comprise three different areas, identifiable by reference to the cure (polymerization) state and the coloration. The back of the recording layer (base of the plate), which has been exposed to actinic radiation of a first level (first dose), is cured (polymerized) without a change in color. The imaged areas on the front of the recording layer, which have been exposed to actinic radiation of a second level (second dose), are cured (polymerized) and colored or bleached by the exposure. The non-image areas on the front of the plate, which have not been exposed, remain unchanged (uncured and no color change). The present invention provides a method for producing a printing plate wherein the image areas on the front of the recording layer can be cured and colored (or bleached), while the back of the recording layer can be cured without being colored (or bleached). Selective coloration of different areas of the same printing plate or recording layer is accomplished by controlling the dose of light.

The unexposed areas of the image-wise exposed recording layer are typically removed by washing or developing the plates with a suitable organic solvent or aqueous solvent which removes the non-photopolymerized or non-cured areas of the photopolymerizable recording layer. During development, the solvent may be applied in any convenient manner, as by pouring, immersion, spraying or roller application. Brushing aids in the removal of the unpolymerized or uncrosslinked portion of the composition. It is also believed that the flexographic plate making systems which utilize dry (thermal) mass image transfer technology as opposed to conventional liquid wash-out developing systems may also benefit from the selective coloration available in accordance with the present invention. One such system is Dupont's Cyrel® FAST system.

The photopolymerizable recording layer of the present invention comprises a photopolymerizable monomer, a radical photoinitiator, a color former and a color photoinitiator. The recording layer may optionally include a polymeric binder. The polymeric binders, photopolymerizable monomers and radical photoinitiators useful in the present invention are those commonly used for the production of photopolymeric flexographic relief printing plates. Representative binders include vinyl aromatic/alkadiene block copolymers (styrene-isoprene-styrene, styrene-butadiene-styrene, styrene-isoprene-styrene/butadiene, etc.), alkadiene/acrylonitrile copolymers (butadiene/acrylonitrile), fluorine rubbers (vinylidene chloride-hexafluoropropylene copolymers), natural rubbers, silicone polymers, polysulfide rubbers or ethylene-propylene-diene terpolymers.

Photopolymerizable monomers useful in the present invention include those typically used in the production of photopolymerized printing plates which are compatible with the binder materials. Examples of such monomers include esters or amides of acrylic acid or methacrylic acid with monofunctional or polyfunctional alcohols, amines, amino alcohols or hydroxy ethers and hydroxy esters. Examples of specific monomers typically used in the production of photopolymerizable flexographic printing plates include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol and the like, and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate.

The photosensitive recording element of the present invention may include one of the known photoinitiators typically used in production of flexographic printing plates. Suitable photoinitiators include vicinal diketones, acyloins, acyloin ethers, alpha-hydrocarbon substituted aromatic acyloins, acyloin esters, substituted and unsubstituted quinones and benzophenones. Photoinitiators can be used separately or in conjunction with other coinitiators.

Conventional photosensitive recording elements useful in the production of flexographic printing plates are readily available commercially and are sold, for example, by BASF under the trademarks or tradenames Nyloflex® FA 170, FA 284, FA 470, FAR 284, MA 275 or OF 284, by DuPont de Nemours under the trademarks or tradenames CYREL® HOS 112, PQS 112, DRS 112 or PLS 112, by Asahi Chemical Corp. under the trademark or trade name AFP®284, by Grace under the trademark or trade name Flexlight® KOR 284, formerly belonging to Uniroyal, or by Tokyo Okha Kogyo K.K. under the trademark or trade name Elaslon®Green 284. In addition to solid recording elements (those containing a polymeric binder), liquid plates are also useful in accordance with the present invention. Specific mention may be made of MacDermid Graphic Arts Flexlight PRISM 25 liquid plates. Liquid plates are made in a similar fashion except the starting material is a liquid acrylate composition which does not contain a polymeric binder.

Color photoinitiators, as used herein, are agents capable of reacting with a leuco dye or a reducible dye upon excitation and inducing or generating color formation or color change in a leuco dye or reducible dye. Examples of color photoinitiators useful in the present invention include oxidizing agents (such as onium salts) and reducing agents (such as amines).

Oxidizing agents useful in the present invention include compounds which are electron acceptors capable of oxidizing a leuco dye and generating a colored carbocation. Typical photosensitive oxidizing agents include onium salts such as iodonium, sulfonium and the like, transition metals, iron salts, uranyl salts, etc. used in the absence or presence of an oxidizing species such as hydrogen peroxide. The oxidizing agent, to oxidize a leuco dye, will have a photoreduction potential less than the color former.

Onium salts such as sulfonium or iodonium salts are particularly preferred for use as oxidizing agents in the invention. It is believed that upon photochemical or thermal decomposition, an iodonium salt generates radicals and cations while oxidizing the color former or generating an acidic species which converts the color former into its colored form.

While triarylsulfonium salts such as triarylsulfonium hexafluoroantimonate or mixtures of triarylsulfonium hexafluoroantimonates and the like are preferred onium salts, other sulfonium salts and iodonium salts are also suitable for use in the invention. Decomposition of triarylsulfonium hexafluoroantimonate can be achieved photochemically. Examples of onium salts useful in the present invention include iodonium salts and sulfonium salts and, more particularly, diaryliodonium hexaflurophosphates, diaryliodonium arsenates and diaryliodonium antimonates. The counter ion of the onium salts is usually a nonnucleophilic semimetal complex such as $B(C_6 F_5)_4^-$, $Al(C_6 F_5)_4^-$, $Ga(C_6 F_5)_4^-$, $In(C_6 F_5)_4^-$, $Th(C_6 F_5)_4^-$, $SbF_6^-$, $AsF_6^-$, $PF_6^-$, and $BF_4^-$. A more complete list of iodonium salts appears in published International Application PCT/US/95/05613. Representative examples of iodonium salts include salts having the following structures: $C_nH_{2n+1} C_6H_4I^+(C_6H_5)$, $(C_nH_{2n+1}C_6H_4)_2I^+$, $(C_nH_{2n+1}OC_6H_4)I^+(C_6H_5)$ and $(C_nH_{2n+1}OC_6H_4)_2I^+$ where n is preferably 1 to 12 and typically 8 to 12 and most preferably, the diaryliodonium salts such as 4,4'-dimethyldiphenyliodonium tetrafluoroborate and (4-octyloxyphenyl) phenyliodonium hexafluoroantimonate (OPPI). Representative examples of sulfonium salts include triarylsulfonium hexafluoroantimonate, triarylsulfonium hexafluorophosphate, triarylsulfonium tetra(perfluoro) phenylgallate, tetra(perfluoro)phenylborate and the like. Examples of particularly preferred onium salts include 1.) OPPI and 2.) a mixture of triarylsulfonium hexafluoroantimonates (UVI-6974 from Union Carbide).

Color formers found to be useful in the present invention include those chromogenic materials which have been previously taught for use in various imaging systems. In general, these materials are colorless compounds which are capable of reacting with acid as is well known in the art or whose excited states are capable of donating electron to generate a colored dye. Alternatively, color contrast may be the result of the interaction between a dye and a reducing agent or the bond breaking of a leucodye capable of forming color by bond heterolysis.

Representative examples of leucodye color formers include substantially colorless compounds having in their partial skeleton a lactone, a lactam, a sultone, an ester or an amido structure. Specifically, there are triarylmethane compounds, bisphenylmethane compounds, xanthene compounds, thiazine compounds, and the like. Typical examples of them include Crystal Violet lactone, benzoyl leuco methylene blue, Malachite Green Lactone, p-nitrobenzoyl leuco methylene blue, 3-dialkylamino-7-dialkylamino-fluoran, 3-methyl-2,2'-spirobi(benzo-f-chrome), 3,3-bis(p-dimethylaminophenyl)phthalide, 3-(p-dimethylaminophenyl)-3-(1,2 dimethylindole-3-yl) phthalide, 3-(p-dimethylaminophenyl)-3-(2-methylindole-3-yl)phthalide, 3-(p-dimethylaminophenyl)-3-(2-phenylindole-3-yl)phthalide, 3,3- bis(1,2-dimethylindole-3-yl)-5-dimethylaminophthalide, 3,3-bis-(1,2-dimethylindole-3-yl)6-dimethylaminophthalide, 3,3-bis-(9-ethylcarbazole-3-yl)-5-dimethylaminophthalide, 3,3-bix(2-phenylindole-3-yl)-5-dimethylaminophthalide, 3-p-dimethylaminophenyl-3-(1-methyl pyrrole-2-yl)-6-dimethylaminophthalide, 4,4'-bis-dimethylaminobenzhydrin benzyl ether, N-halophenyl leuco Auramine, N-2,4,5-trichlorophenyl leuco Auramine, Rhodamine-B-anilinolactam, Thodamine-(p-nitroanilino) lactam, Rhodamine-B-(p-chloroanilino)lactam, 3-dimethylamino-6-methoxyfluoran, 3-diethylamino-7-methoxyfluoran, 3-diethylamino-7-chloro-6-methylfluoroan, 3-diethylamino-6-methyl-7-anilinofluoran, 3-diethylamino-7-(acetylmethylamino)fluoran, 3-diethylamino-7-(dibenzylamino)fluoran, 3-diethylamino-7-(methylbenzylamino)fluoran, 3-diethylamino-7-(chloroethylmethylamino)fluoran, 3-diethylamino-7-(diethylamino)fluoran, etc. Additional examples of useful color formers are described in commonly assigned U.S. Pat. No. 5,942,554 to Ren et al. which is hereby incorporated by reference. Mixtures of these color formers can be used if desired. Also useful in the present invention are the fluoran color formers disclosed in U.S. Pat. No. 3,920,510, which is also incorporated herein by reference.

It is also believed that leucobase color formers would be useful in the present invention. As described in commonly assigned U.S. patent application Ser. No. 09/638,252 (Attorney Docket No. 594562-027), the interaction of a leucobase color former and an oxidizing agent can provide the basis for a photosensitive selectively colorable composition. The leucobase color former yields a dye cation upon actinic exposure in the presence of an oxidizing agent via an electron-transfer process. The dye cation can then be bleached upon further actinic exposure to yield colorless species. Examples of leucobases which yield a colored cation upon exposure to actinic radiation in the presence of an oxidizing agent include thiazine, oxazine and phenazine leucobases as well as triarylmethane leucobases (TAM-X), diarylmethane leucobases (DAM-X) and monoarylmethane leucobases (Ar—$CR_2X$) wherein X is H, OH, OR, $NR_2$, N-heterocycle, and R is hydrogen, a straight chain, branched chain or cyclic alkyl group containing 1 to 20 carbon atoms, aryl (e.g., phenyl) or aralkyl (e.g., a phenylalkyl group in which the alkyl moiety contains 1 to 6 carbon atoms) and the like. Preferably, the color former in accordance with this embodiment of the invention is a triarylmethane or diarylmethane leucobase susceptible to oxidation, with diarylmethane leucobase (DAM-H) being the most preferred color former.

Examples of triarylmethane leucobase color formers include tris(4-(N,N-dimethylamino)phenyl)methane (Leuco Crystal Violet), tris(4-aminophenyl)methane (Leuco Basic Fuchsin), bis(4-(N,N-dimethylamino)phenyl) pentafluorophenylmethane, bis(4-(N,N-dimethylamino) phenyl)-2-fluorophenylmethane, bis(4-(N,N-dimethylamino)phenyl)-3-fluorophenylmethane, bis(4-(N,N-dimethylamino)phenyl)-2,6-difluorophenylmethane, bis (3-(2-methylindyl))phenylmethane, and the like.

Examples of diarylmethane leucobase color formers include bis(4-aminophenyl)methane, bis(4-(N,N-dimethylamino)phenyl)methane, bis(4-amino-3,5-dimethylphenyl)methane, bis(4-amino-3-chlorophenyl) methane, bis(4-amino-2-chloro-3,5-diethylphenyl)methane, bis(4-aminophenyl)methane, 4-aminophenyl-(4-amino-3-bromophenyl)methane and the like.

Another color forming mechanism believed to be useful in the present invention is described in commonly assigned U.S. patent application Ser. No. 09/638,252 (Attorney Docket No. 594562-027) which discloses the use of two different color formers to generate a photosensitive, polychromic composition. The first color former yields a first dye cation of a first color upon actinic exposure in the presence of an oxidizing agent. The second color former undergoes heterolysis upon actinic exposure to yield a second dye cation of a second color and a leaving group. In accordance with one embodiment, the dye cation formed from heterolysis of the second (typically a leuconitrile) color former is bleachable at high doses of actinic radiation. Therefore, a selectively colorable, polychromic composition is obtained wherein low light exposure creates a polymer of one color, intermediate light exposure changes the color of the polymer and a high dosage of light exposure bleaches the color of the polymer.

Color formers which yield a colored cation upon exposure to actinic radiation in the presence of an oxidizing agent include thiazine, oxazine and phenazine leuco dyes as well as triarylmethane leuco dyes (TAM-X), diarylmethane leuco dyes (DAM-X) and monoarylmethane leuco dyes (Ar—$CR_2X$) wherein X is H, OH, OR, $NR_2$, N-heterocycle, and R is hydrogen, alkyl, aryl or aralkyl and the like. Preferably, the color former is a triarylmethane or diarylmethane leuco base susceptible to oxidation, with triarylmethane leuco base (TAM-H) being the most preferred color former.

The second type of color formers useful in this system include those which form color primarily through heterolysis to generate a dye cation and a leaving group (L). These color formers can also be used alone to generate a visible color reaction based on bond heterolysis. Suitable color formers of this type are, for example, triarylmethane leuco dyes (TAM'-L), diarylmethane leuco dyes (DAM'-L) and monoarylmethane leuco dyes (Ar'—$CR_2L$) wherein L is a leaving group such as CN, $SO_2$, $P(O)OR_2$, or $CH_2$-heterocycle, etc. Irradiation of these color formers causes heterolysis with dye formation and release of the leaving group moiety. Examples of preferred color formers susceptible to photochemical heterolysis include triarylmethane leuconitriles such as tris(4-(N,N-dimethylamino)phenyl) cyanomethane (Crystal Violet Leuconitrile), bis(4-(N,N-dimethylamino)phenyl)(phenyl)cyanomethane (Malachite Green Leuconitrile), tris(4-aminophenyl)cyanomethane (Basic Fuchsin Leuconitrile), bis(4-N,N-dimethylamino) phenyl)(pentafluorophenyl) cyanomethane, bis(4-(N,N-dimethylamino)phenyl)-(2-fluorophenyl)cyanomethane, bis (4-(N,N-dimethylamino)phenyl)-(3-fluorophenyl) cyanomethane, bis(4-(N,N-dimethylamino)phenyl)-(2,6-difluorophenyl)cyanomethane, bis(3-(2-methylindyl)) (phenyl)cyanomethane, bis(4-aminophenyl)-(4-amino-3-methylphenyl)cyanomethane (Unsymmetric Basic Fuchsin Leuconitrile), tris[4-(N-triphenylmethyl)aminophenyl] cyanomethane (Protected Basic Fuchsin Leuconitrile), bis(4-(N,N-diethylamino)phenyl)(1-[4-(N-ethylamino)naphthyl]) cyanomethane (Victoria Pure Blue Leuconitrile) and the like.

Color contrast can also be generated through the reaction of a reducing agent with a reducible dye. Reducing agents useful in the present invention include compounds which are electron donors capable of reducing the reducible dye and generating a colorless anion, radical anion or radical which converts into a stable leucodye. Typical photosensitive reducing agents include molecules with free electron pairs, such as amines, borates, gallates, stannates and the like. N-phenylglycine (NPG) is a useful reducing agent. Examples of other useful reducing agents are discussed in Eaton, D. F., "Dye Sensitized Photopolymerization", Advances in Photochemistry, Vol. 13, pp. 427–486. N,N-dialkylanilines are also particularly useful. Other tertiary amines such as diethanolamine, triethanolamine, and arylsulfinates can also be used. Alkyl borate salts such as ammonium and pyridinium salts of tetrahydrocarbyl boranyl anions are also useful reducing agents. Useful boranylanions are disclosed in U.S. Pat. No. 4,772,541.

Reducible dyes useful in the present invention are not particularly limited. Examples include xanthene, fluorone, pyronine, methine, polymethine, triarylmethane, indoline, thiazine, acridine, xanthane, oxazine and acridine dyes. Specific examples are disclosed in U.S. Pat. No. 5,623,080 to Neckers, et al. and U.S. Pat. No. 5,639,802 to Neckers, et al., the disclosures of which are incorporated herein by reference.

The photosensitive recording elements are usually produced by mixing the components by means of a conventional kneading, mixing or dissolution method and by shaping the resulting photopolymerizable mixtures into photopolymerizable layers or elements by casting from solution, hot pressing, calendering or extruding. The layer or element may be laminated to the surface of a suitable permanent support or, if necessary, it may be affixed by means of a suitable adhesive, or the solution may be coated directly onto a suitable support. Suitable supports, depending on the intended use, include polyester and polyester/polyamide sheets, with polyethylene terephthalate sheets being preferred.

The photosensitive recording element of the present invention may also include a transparent coversheet such as a thin film of polystyrene, polyethylene, polypropylene or other strippable material to prevent contamination of or damage to the photosensitive layer during storage or manipulation. The photosensitive recording element may also contain other components, such as, for example, fillers, dyes, antioxidants, antiozonants, thermal polymerization inhibitors, and plasticizers in the customary amounts.

Solvents may be necessary to dissolve components of the system including the photoinitiator, the color former, etc., if they are not sufficiently soluble in the monomer. Some examples of useful solvents are ethyl acetate, etc. Other useful solvents can be identified readily.

The nature of the monomer or polymerizable material, the amount of the color former and oxidizing agent or reducing agent, if present, in curable self-coloring compositions in accordance with the present invention will vary with the thickness of the plates, the emission characteristics of the exposure sources, the development procedures, the physical properties desired in the polymerized product and other factors. With this understanding, compositions in accordance with the invention will generally fall within the following compositional ranges in parts by weight (based on 100 parts total).

| Binder | 0 to 95 |
| --- | --- |
| Monomer | 5 to 98 |
| Color Former(s) | 0.01 to 2 |
| Radical Photoinitiator | 0.5 to 5 |
| Color Photoinitiator | 0.005 to 5 |

Compositions in accordance with the invention more typically are anticipated to have the following formulation:

| Binder(s) | 0 to 70 |
| --- | --- |
| Monomer(s) | 15 to 95 |
| Color Former(s) | 0.05 to 1 |
| Radical Photoinitiator | 1 to 4 |
| Color Photoinitiator | 0.05 to 1 |

Preferably, the color formers are present in an amount sufficient to provide a contrast ratio of at least 2, more preferably at least 8, or provide a contrast ratio of less than 0.5 in the case of reverse contrast. The term "contrast ratio" as used herein refers to the ratio of absorbance maximum values at two doses. These doses typically are the relief exposure and the dose at which the polymer is formed (back exposure) unless specified otherwise. As used herein, contrast ratio refers to the absorbance of the colored polymeric film or body at the high irradiation dose divided by the absorbance at the low dose at the specified wavelength. Contrast ratio is a function of a number of variables including, but not limited to, the light source, irradiation dosage, curable compound, photoinitiator and color formers. The number of color formers, type of color formers, the concentration of the color formers, the interaction between the different color formers and the relative concentrations of the color formers influence the contrast ratio.

The present invention is further illustrated by the following, non-limiting examples:

EXAMPLE 1

Dupont Cyrel resin was mixed with a Copikem color former (such as Copikem 5 Green at 0.2%) and a 365 nm photoacid generator in the form of sulfonium salt (UVI-6974 at 0.2%). The three components were dissolved in THF (50% of solid components by weight).

A 0.5–1 mm layer of the mixture above is cast on a glass slide. It is exposed to the full spectrum of Fusion 'H-bulb' (high pressure mercury lamp). The initial resin color was light red. After the film was exposed to 500 mJ/cm$^2$ the resin retained its original color. However, further exposure at a much higher dose (total of 3–7 J/cm$^2$) resulted in the color development. Thus, the film color became light green.

A contrast ratio is measured at the maximum absorption with the absorbance at the high dose being rationed to the absorbance at the lowest dose at the specified wavelength. Absorption spectrometer measurements revealed no absorption due to the green dye after 500 mJ/cm$^2$ and two distinctive peaks (absorption wavelength 450 and 590 nm) of the green dye after 5 J/cm$^2$. In short, the system has almost perfect color contrast under these conditions.

EXAMPLE 2

Dupont Cyrel resin was mixed with a phthalide (lactone) color former and a 365 nm photoacid generator in the form of sulfonium salt (UVI-6974). These three components were dissolved in THF (30–50% of solid components by weight).

A 0.5–1 mm layer of prepolymer solution was cast from THF on a glass slide. Alternatively, the solution was poured into 2 by 2 by 0.5 cm teflon wells. The solvent was evaporated. Next, the samples were exposed to 130° C. for 5 minutes to simulate the extruder conditions. Then, they were exposed to the full spectrum of Fusion 'H-bulb' high pressure mercury lamp. The initial resin color was light red due to the dyestuff present in the original Cyrel resin. After the film was exposed to 500 mJ/cm$^2$ it retained is original color. Further exposure (total of 3–12 J/cm$^2$) resulted in the color development, thus, the film color became the color of the dye that was added in the mixing step.

The data are summarized in the table below:

| Concentration of UVI-6974, wt. % | Color former | Concentration of color former, wt. % | Dose, mJ/cm$^2$ | Color intensity 0-no color, 1-least intense, 10-most intense |
|---|---|---|---|---|
| 0.15% | Copikem 16 Magenta max = 540 nm | 0.15% | 0 500 5000 | 0 2 9 |
| 0.05% | Copikem 7 Grape max = 590 nm | 0.05% | 0 500 5000 | 0 1 4 |
| 0.15% | Copikem 1 Blue (CVL) max = 610 nm | 0.15% | 0 500 5000 | 0 1 6 |
| 0.15% | Copikem 7 grape max = 590 nm | 0.15% | 0 500 5000 | 0 4 10 |
| 0.25% | Copikem 1 Blue (CVL) max = 610 nm | 0.25% | 0 500 5000 | 0 1 8 |
| 0.25% | Copikem 1 Blue (CVL) max = 610 nm | 0.15% | 0 500 5000 | 0 1 8 |
| 0.10% | Copikem 1 Blue (CVL) max = 610 nm | 0.25% | 0 500 5000 | 0 1 4 |
| 0.25% | Copikem 1 Blue (CVL) max = 610 nm | 0.10% | 0 500 5000 | 0 1 7 |
| 0.10% | Copikem 7 Grape max = 590 nm | 0.10% | 0 500 5000 | 0 1 8 |

Visual observation of estimated color intensities: 1-little traces of color, 2-barely seen, 4-weak color, 6-color can be easily seen, 8-pronounced color, 10-very intense color.

The best mixtures are those that have the largest ratios between the intensities at 5000 and 500 mJ/cm$^2$. The results also show that the color intensity strongly depends on the concentration of UVI-6974 and has a slight dependence on leuco dye concentration.

Although the invention has been described primarily with reference to the production of flexographic printing plates, it should be apparent to those skilled in the art that the photosensitive recording element and the method of producing the recording element as described herein may be used for a wide range of purposes such as formation of lithographic printing plates, photoresists, etc.

Having described the invention in detail, it will be apparent that modifications and variations are possible without departing from the scope of the invention defined in the appended claims.

What is claimed is:

1. A method for producing a printing plate from a photosensitive recording element comprising the steps of:

(a) providing a photosensitive recording element containing a photopolymerizable recording layer having a front surface and a back surface wherein said recording layer comprises:
      a photopolymerizable monomer,
      a radical photoinitiator,
      a color photoinitiator and
      a color former;
   (b) exposing the back surface of said photopolymerizable recording layer to a first dose of actinic radiation thereby forming a cured back surface on said recording layer;
   (c) imagewise exposing the front surface of said photopolymerizable recording layer to a second dose of actinic radiation thereby forming exposed and unexposed areas on the front surface of said recording layer wherein the exposed areas are cured by exposure to the actinic radiation; and
   (d) removing the unexposed areas of the imagewise exposed recording layer thereby forming an image in relief;
   wherein the image and the cured back surface of the recording layer provide a visually detectable color contrast.

2. The method of claim 1 wherein said photosensitive recording element further comprises a support having disposed thereon in the following order, said photopolymerizable recording layer and a coversheet.

3. The method of claim 1 wherein said step of removing the unexposed areas of the imagewise exposed recording layer comprises washing out the unexposed areas of the layer with a solvent or aqueous developer.

4. The method of claim 1 said recording layer further comprises a polymeric binder.

5. The method of claim 4 wherein said polymeric binder is selected from the group consisting of copolymers of butadiene and styrene, copolymers of isoprene and styrene, styrene-diene-styrene triblock copolymers, chloroprene, nitrile rubbers, urethane elastomers, butyl rubbers and derivatives thereof.

6. The method of claim 5 wherein said binder is selected from the group consisting of polystyrene-polybutadiene-polystyrene (SBS), polystyrene-polyisoprene-polystyrene (SIS) and polystyrene-poly(ethylenebutylene)-polystyrene (SEBS).

7. The method of claim 6 wherein said binder is a SIS block copolymer.

8. The method of claim 1 wherein said color photoinitiator is an oxidizing agent.

9. The method of claim 8 wherein said oxidizing agent is an onium salt selected from the group consisting of sulfonium salts and iodonium salts.

10. The method of claim 9 wherein said sulfonium salt is a triarylsulfonium salt.

11. The method of claim 1 wherein said color former is selected from the group consisting of lactone derivatives, fluoran derivatives, phthalide derivatives, diphenylmethane derivatives, triphenylmethane derivatives and mixtures thereof.

12. The method of claim 11 wherein said color former is a lactone derivative.

13. The method of claim 1 wherein said color former is a leucobase color former which yields a dye cation upon exposure in the presence of an oxidizing agent via electron transfer process and the dye cation can be bleached by further irradiation.

14. The method of claim 13 wherein said polymerizable recording layer further comprises a leuconitrile color former which yields a second dye cation and a leaving group by heterolysis, wherein said first dye cation is bleached by further radiation in the presence of said leuconitrile color former.

15. The method of claim 1 wherein said color former is a reducible dye and said color photoinitiator is a reducing agent.

16. The method of claim 15 wherein said reducible dye is selected from the group consisting of xanthene, fluorone, pyronine, methine, polymethine, triarylmethane, indoline, thiazine, acridine, xanthane, oxazine and acridine dyes.

17. The method of claim 1 wherein said color former is a lactone and said color photoinitiator is an onium salt.

18. The method of claim 17 wherein said onium salt is a sulfonium salt.

19. The method of claim 1 wherein said first dose of actinic radiation is lower than said second dose of actinic radiation.

20. The method of claim 19 wherein said first dose is about 500 mJ/cm$^2$ and said second dose is about 5000 mJ/cm$^2$.

21. The method of claim 1 wherein the cured back of said recording layer and said image provide a contrast ratio of at least 2.

22. The method of claim 21 wherein the contrast ratio is at least 8.

23. The method of claim 1 wherein the cured back of said recording layer and said image provide a contrast ratio of less than about 0.5.

24. A method for producing a printing plate from a photosensitive recording element comprising the steps of:

(a) providing a photosensitive recording element containing a photopolymerizable recording layer having a front surface and a back surface wherein said recording layer comprises:
   a photopolymerizable monomer,
   a radical photoinitiator,
   an oxidizing agent and
   a leuco dye color former;

(b) exposing the back surface of said photopolymerizable recording layer to a first dose of actinic radiation thereby forming a cured back surface on said recording layer; and (c) imagewise exposing the front surface of said photopolymerizable recording layer to a second dose of actinic radiation thereby forming exposed and unexposed areas on the front surface of said recording layer wherein the exposed areas are cured and colored by exposure to the actinic radiation;

wherein the image is of a different color than the non-image areas on the front surface of said recording layer and the image is of a different color than the cured back surface of said recording layer.

25. The method of claim 24 wherein said recording layer further comprises a binder.

26. The method of claim 24 wherein said leuco dye color former is a lactone and said oxidizing agent is an onium salt.

27. The method of claim 25 wherein said leuco dye color former is a lactone and said oxidizing agent is an onium salt.

28. The method of claim 25 wherein said leuco dye color former is a crystal violet lactone and said oxidizing agent is a sulfonium salt.

* * * * *